United States Patent
Ring et al.

(10) Patent No.: US 9,812,338 B2
(45) Date of Patent: Nov. 7, 2017

(54) ENCAPSULATION OF ADVANCED DEVICES USING NOVEL PECVD AND ALD SCHEMES

(71) Applicant: Cree, Inc., Durham, NC (US)

(72) Inventors: Zoltan Ring, Chapel Hill, NC (US); Helmut Hagleitner, Zebulon, NC (US); Daniel Namishia, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 12 days.

(21) Appl. No.: 13/804,126

(22) Filed: Mar. 14, 2013

(65) Prior Publication Data

US 2014/0264960 A1 Sep. 18, 2014

(51) Int. Cl.
| | |
|---|---|
| H01L 25/04 | (2014.01) |
| H01L 51/50 | (2006.01) |
| H01L 51/52 | (2006.01) |
| H01L 21/56 | (2006.01) |
| H01L 23/31 | (2006.01) |

(52) U.S. Cl.
CPC .......... *H01L 21/56* (2013.01); *H01L 23/3135* (2013.01); *H01L 23/3192* (2013.01); *H01L 2924/0002* (2013.01)

(58) Field of Classification Search
CPC ........... H01L 21/0237; H01L 21/02439; H01L 21/02521; H01L 29/12; H01L 31/0256; H01L 33/26; H01L 23/3135; H01L 23/3192; H01L 31/0488
USPC ............ 257/76, E21.055, E21.269, E21.292, 257/E21.293, E29.1, E29.104
See application file for complete search history.

(56) References Cited

U.S. PATENT DOCUMENTS

| | | |
|---|---|---|
| 3,895,127 A | 7/1975 | Comizzoli |
| 3,982,267 A | 9/1976 | Henry |
| (Continued) | | |

FOREIGN PATENT DOCUMENTS

| | | |
|---|---|---|
| EP | 1149934 A2 | 10/2001 |
| EP | 1798762 A2 | 6/2007 |
| (Continued) | | |

OTHER PUBLICATIONS

Notice of Allowance for U.S. Appl. No. 13/644,506, mailed Jul. 18, 2014, 7 pages.

(Continued)

*Primary Examiner* — Mary Wilczewski
*Assistant Examiner* — Tsz Chiu
(74) *Attorney, Agent, or Firm* — Withrow & Terranova, P.L.L.C.

(57) ABSTRACT

Embodiments of a multi-layer environmental barrier for a semiconductor device and methods of manufacturing the same are disclosed. In one embodiment, a semiconductor device is formed on a semiconductor die. The semiconductor die includes a semiconductor body and a passivation structure on the semiconductor body. A multi-level environmental barrier is provided on the passivation structure. The multi-layer environmental barrier is a low-defect multi-layer dielectric film that hermetically seals the semiconductor device from the environment. In one embodiment, the multi-layer environmental barrier has a defect density of less than 10 defects per square centimeter ($cm^2$). By having a low defect density, the multi-layer environmental barrier serves as a robust barrier to the environment.

17 Claims, 6 Drawing Sheets

(56) References Cited

U.S. PATENT DOCUMENTS

| | | | |
|---|---|---|---|
| 4,551,353 A | 11/1985 | Hower et al. | |
| 4,593,302 A * | 6/1986 | Lidow et al. | 257/342 |
| 4,717,641 A | 1/1988 | Belmont et al. | |
| 4,799,100 A | 1/1989 | Blanchard et al. | |
| 5,332,697 A | 7/1994 | Smith et al. | |
| 5,430,324 A | 7/1995 | Bencuya | |
| 5,466,617 A | 11/1995 | Shannon | |
| 5,605,852 A | 2/1997 | Bencuya | |
| 5,650,638 A | 7/1997 | Harris et al. | |
| 5,686,360 A * | 11/1997 | Harvey et al. | 438/28 |
| 5,776,837 A | 7/1998 | Palmour | |
| 5,972,801 A | 10/1999 | Lipkin et al. | |
| 6,001,716 A | 12/1999 | Liao | |
| 6,246,076 B1 | 6/2001 | Lipkin et al. | |
| 6,396,090 B1 | 5/2002 | Hsu et al. | |
| 6,426,542 B1 | 7/2002 | Tan | |
| 6,429,518 B1 | 8/2002 | Endo | |
| 6,437,371 B2 | 8/2002 | Lipkin et al. | |
| 6,528,373 B2 | 3/2003 | Lipkin et al. | |
| 6,586,781 B2 | 7/2003 | Wu et al. | |
| 6,610,366 B2 | 8/2003 | Lipkin | |
| 6,611,014 B1 | 8/2003 | Kanaya et al. | |
| 6,673,662 B2 | 1/2004 | Singh | |
| 6,767,843 B2 | 7/2004 | Lipkin et al. | |
| 6,797,586 B2 | 9/2004 | Dev | |
| 6,825,501 B2 | 11/2004 | Edmond et al. | |
| 6,849,882 B2 | 2/2005 | Chavarkar et al. | |
| 6,939,756 B1 | 9/2005 | Chung et al. | |
| 7,332,795 B2 | 2/2008 | Smith et al. | |
| 7,525,122 B2 | 4/2009 | Ring et al. | |
| 7,598,576 B2 | 10/2009 | Ward, III et al. | |
| 7,696,584 B2 | 4/2010 | Henning et al. | |
| 7,855,401 B2 | 12/2010 | Sheppard et al. | |
| 7,858,460 B2 | 12/2010 | Ring et al. | |
| 8,247,811 B2 | 8/2012 | Morosawa et al. | |
| 8,633,585 B2 | 1/2014 | Schmid et al. | |
| 2001/0009788 A1 | 7/2001 | Lipkin et al. | |
| 2001/0019168 A1 | 9/2001 | Willer et al. | |
| 2001/0023964 A1 | 9/2001 | Wu et al. | |
| 2001/0028100 A1 | 10/2001 | Schmitz et al. | |
| 2001/0050369 A1 | 12/2001 | Zeng et al. | |
| 2002/0011656 A1 | 1/2002 | Swanson et al. | |
| 2002/0052076 A1 | 5/2002 | Khan et al. | |
| 2002/0121641 A1 | 9/2002 | Alok et al. | |
| 2003/0020092 A1 | 1/2003 | Parikh et al. | |
| 2003/0025121 A1 | 2/2003 | Edmond et al. | |
| 2003/0098497 A1 | 5/2003 | Solayappan et al. | |
| 2003/0117066 A1* | 6/2003 | Silvernail | H01L 51/5237 313/504 |
| 2003/0160274 A1 | 8/2003 | Das et al. | |
| 2003/0201453 A2 | 10/2003 | Edmond | |
| 2003/0209708 A1* | 11/2003 | Kubota | H01L 51/5237 257/40 |
| 2004/0084701 A1 | 5/2004 | Kanaya et al. | |
| 2004/0099888 A1 | 5/2004 | Sriram | |
| 2004/0099928 A1 | 5/2004 | Nunan et al. | |
| 2004/0118202 A1 | 6/2004 | Iwaki et al. | |
| 2004/0159865 A1 | 8/2004 | Allen et al. | |
| 2004/0160118 A1 | 8/2004 | Knollenberg et al. | |
| 2004/0202097 A1* | 10/2004 | Oyake et al. | 369/283 |
| 2005/0019971 A1 | 1/2005 | Slater, Jr. et al. | |
| 2005/0097941 A1 | 5/2005 | Sandvik et al. | |
| 2005/0110042 A1 | 5/2005 | Saito et al. | |
| 2005/0133835 A1 | 6/2005 | Bu et al. | |
| 2005/0156284 A1 | 7/2005 | Schmidt | |
| 2005/0170574 A1 | 8/2005 | Sheppard et al. | |
| 2005/0193800 A1 | 9/2005 | DeBoer et al. | |
| 2005/0212075 A1 | 9/2005 | Neidig | |
| 2005/0221628 A1 | 10/2005 | Tanaka et al. | |
| 2005/0258431 A1 | 11/2005 | Smith et al. | |
| 2005/0274980 A1 | 12/2005 | Miyoshi | |
| 2005/0285233 A1 | 12/2005 | Huang et al. | |
| 2006/0006414 A1 | 1/2006 | Germain et al. | |
| 2006/0006415 A1 | 1/2006 | Wu et al. | |
| 2006/0043379 A1 | 3/2006 | Zhang et al. | |
| 2006/0043437 A1 | 3/2006 | Mouli | |
| 2006/0118892 A1 | 6/2006 | Wu et al. | |
| 2006/0145190 A1 | 7/2006 | Salzman et al. | |
| 2006/0145283 A1 | 7/2006 | Zhu et al. | |
| 2006/0157733 A1 | 7/2006 | Lucovsky et al. | |
| 2006/0191474 A1 | 8/2006 | Chen et al. | |
| 2006/0202272 A1 | 9/2006 | Wu et al. | |
| 2007/0001174 A1* | 1/2007 | Ring et al. | 257/76 |
| 2007/0001176 A1 | 1/2007 | Ward, III et al. | |
| 2007/0018198 A1 | 1/2007 | Brandes et al. | |
| 2007/0018199 A1 | 1/2007 | Sheppard et al. | |
| 2007/0018272 A1 | 1/2007 | Henning et al. | |
| 2007/0164321 A1 | 7/2007 | Sheppard et al. | |
| 2007/0164322 A1 | 7/2007 | Smith et al. | |
| 2008/0035934 A1* | 2/2008 | Sheppard et al. | 257/76 |
| 2008/0286968 A1 | 11/2008 | Carta et al. | |
| 2009/0215280 A1 | 8/2009 | Ring et al. | |
| 2010/0193772 A1* | 8/2010 | Morosawa et al. | 257/40 |
| 2010/0193839 A1 | 8/2010 | Takatani | |
| 2010/0279092 A1 | 11/2010 | Hwang et al. | |
| 2010/0304047 A1 | 12/2010 | Yang et al. | |
| 2011/0151173 A1 | 6/2011 | Ramadas et al. | |
| 2012/0281452 A1* | 11/2012 | Huo | H01L 27/2463 365/148 |
| 2012/0319572 A1* | 12/2012 | Lee et al. | 313/512 |
| 2013/0037804 A1* | 2/2013 | Lee et al. | 257/49 |
| 2013/0226268 A1 | 8/2013 | Pan | |
| 2014/0048781 A1 | 2/2014 | Chang | |
| 2014/0097469 A1 | 4/2014 | Hagleitner et al. | |

FOREIGN PATENT DOCUMENTS

| | | |
|---|---|---|
| EP | 1972013 A2 | 9/2008 |
| EP | 2031648 A2 | 3/2009 |
| JP | H056886 A | 1/1993 |
| JP | H05218015 A | 8/1993 |
| JP | H05234991 A | 9/1993 |
| JP | 2009094311 A | 4/2009 |
| JP | 2010109276 A | 5/2010 |
| TW | 471049 B | 1/2002 |
| TW | 474024 B | 1/2002 |
| TW | 579600 B | 3/2004 |
| WO | 0113436 A1 | 2/2001 |
| WO | 0249114 A2 | 6/2002 |
| WO | 03032397 A2 | 4/2003 |
| WO | 2005076365 A1 | 8/2005 |
| WO | 2005114743 A2 | 12/2005 |
| WO | 2005117129 A1 | 12/2005 |
| WO | 2006098801 A1 | 9/2006 |
| WO | 2007002860 A1 | 1/2007 |
| WO | 2007018653 A2 | 2/2007 |
| WO | 2007018918 A2 | 2/2007 |
| WO | 2007064689 A1 | 6/2007 |
| WO | 2007081528 A2 | 7/2007 |
| WO | 2011125928 A1 | 10/2011 |

OTHER PUBLICATIONS

Non-Final Office Action for U.S. Appl. No. 11/169,378, mailed Dec. 10, 2007, 7 pages.

Notice of Allowance for U.S. Appl. No. 11/169,378, mailed Jan. 26, 2009, 7 pages.

Notice of Allowance for U.S. Appl. No. 11/169,378, mailed Jul. 29, 2008, 7 pages.

Restriction Requirement for U.S. Appl. No. 11/169,378, mailed Aug. 29, 2007, 5 pages.

Notice of Allowance for U.S. Appl. No. 11/845,805, mailed Aug. 12, 2010, 6, pages.

Non-Final Office Action for U.S. Appl. No. 11/845,805, mailed Apr. 2, 2010, 13 pages.

Notice of Allowance for U.S. Appl. No. 12/404,557, mailed Aug. 19, 2010, 6 pages.

Non-Final Office Action for U.S. Appl. No. 11/328,550, mailed Jun. 27, 2008, 7 pages.

Notice of Allowance for U.S. Appl. No. 11/328,550, mailed Mar. 30, 2009, 6 pages.

(56) References Cited

OTHER PUBLICATIONS

Notice of Allowance for U.S. Appl. No. 11/328,550, mailed Oct. 7, 2008, 7 pages.
Restriction Requirement for U.S. Appl. No. 11/328,550, mailed May 2, 2008, 7 pages.
Non-Final Office Action for U.S. Appl. No. 11/462,016, mailed May 11, 2009, 14 pages.
Notice of Allowance for U.S. Appl. No. 11/462,016, mailed Dec. 4, 2009, 8 pages.
Restriction Requirement for U.S. Appl. No. 11/462,016, mailed Dec. 29, 2008, 7 pages.
Restriction Requirement for U.S. Appl. No. 13/644,506, mailed Oct. 9, 2013, 6 pages.
Chung, G.Y. et al. "Effect of Nitric Oxide Annealing on the Interface Trap Densities Near the Band Edges in the 4H Polytype of Silicon Carbide," Applied Physics Letters, vol. 76, No. 13, Mar. 27, 2000, pp. 1713-1715.
Ganem, J.J. et al., "NRA and XPS Characterizations of Layers Formed by Rapid Thermal Nitridation of Thin SIO2 Films," Nuclear Instruments & Methods in Physics Research, Section B: Beam Interactions with Materials and Atoms, vol. 1364, No. 1-4, 1992, pp. 744-749.
Hagleitner, Helmut et al., "Hydrogen Mitigation Schemes in the Passivation of Advanced Devices,"U.S. Appl. No. 13/644,506, filed Oct. 4, 2012, 21 pages.
Li, H.F. et al., "Improving SiO2 Grown on P-type 4H-SiC by NO Annealing," Materials Science Forum, vol. 264-268, 1998, pp. 869-872.
Lipkin et al., "Improved Oxidation Procedures for Reduced SiO2/SiC defects," Journal of Electronic Materials, vol. 25, No. 5, 1996, pp. 909-915.
Ohno, Y. et al., "Effects of Surface Passivation on Breakdown of AlGaN/GaN High-Electron-Mobility Transistors," Applied Physics Letters, vol. 84, No. 12, Mar. 22, 2004, pp. 2184-2186.
International Search Report for PCT/US2006/048817, mailed Jun. 25, 2007, 3 pages.
Taiwanese Search Report for Taiwanese Patent Application No. 095123557, mailed Jan. 15, 2009, 1 page.
Extended European Search Report for European Patent Application No. 08163116.0, mailed Jan. 15, 2010, 2 pages.
Japanese Office Action for Japanese Patent Application No. 2008-218759 mailed May 17, 2012, 9 pages.
Examination Report for European Patent Application No. 08163116.0, mailed Aug. 30, 2013, 4 pages.
Notice of Allowance for U.S. Appl. No. 12/404,557, mailed Apr. 12, 2010, 6 pages.
International Search Report and Written Opinion for PCT/US2013/061798, mailed Dec. 20, 2013, 10 pages.
Non-Final Office Action for U.S. Appl. No. 13/644,506, mailed Dec. 24, 2013, 12 pages.
Invitation to Pay Additional Fees and Partial Search for PCT/US2014/011286, mailed Apr. 23, 2014, 6 pages.
International Search Report and Written Opinion for PCT/US2014/011286, mailed Jun. 17, 2014, 16 pages.
Summons to Attend Oral Proceedings for European Patent Application 06785888.6, mailed Apr. 15, 2014, 7 pages.
Japanese Office Action for Japanese Patent Application No. 2013-077659, mailed Jun. 24, 2014, 6 pages.
Notice of Allowance for U.S. Appl. No. 13/644,506, mailed Apr. 15, 2014, 7 pages.
Notice of Allowance for U.S. Appl. No. 13/644,506, mailed Nov. 7, 2014, 5 pages.
Decision of Rejection for Japanese Patent Application No. 2013-077659, mailed Mar. 3, 2015, 8 pages.
International Preliminary Report on Patentability for PCT/US2013/061798, mailed Apr. 16, 2015, 7 pages.
International Preliminary Report on Patentability for PCT/US2014/011286, mailed Sep. 24, 2015, 11 pages.
Decision to Refuse for European Patent Application No. 06 785 888.6, mailed Jul. 16, 2015, 13 pages.
Non-Final Office Action for U.S. Appl. No. 14/497,568, mailed Oct. 18, 2016, 19 pages.
Appeal Decision of Refusal for Japanese Patent Application No. 2013-077659, issued Sep. 27, 2016, 21 pages.
Notice of Reasons for Rejection for Japanese Patent Application No. 2015-535697, mailed Nov. 15, 2016, 12 pages.
Non-Final Office Action for U.S. Appl. No. 14/497,568, mailed May 5, 2016, 19 pages.
Notice of Preliminary Rejection for Korean Patent Application No. 10-2015-7011180, mailed Jul. 28, 2016, 10 pages.
Examination Report for European Patent Application No. 08163116.0, mailed Oct. 14, 2015, 4 pages.
Pre-appeal Reexamination Report for Japanese Patent Application No. 2013-077659, mailed Sep. 28, 2015, 4 pages.
Final Office Action for U.S. Appl. No. 14/497,568, mailed Apr. 3, 2017, 22 pages.
Notice of Allowance for Korean Patent Application No. 10-2015-7011180, mailed Jan. 26, 2017, 4 pages.
Non-Final Office Action for U.S. Appl. No. 14/497,568, mailed Nov. 6, 2015, 20 pages.
Examination Report for European Patent Application No. 13774322.5, dated May 31, 2017, 6 pages.
Notice of Reasons for Rejection for Japanese Patent Application No. 2015-535697, dated Aug. 1, 2017, 5 pages.

* cited by examiner

ENCAPSULATION OF ADVANCED DEVICES USING NOVEL PECVD AND ALD SCHEMES

GOVERNMENT SUPPORT

This invention was made with government funds under contract number 11-D-5309 awarded by the Department of Defense. The U.S. Government may have rights in this invention.

FIELD OF THE DISCLOSURE

The present disclosure relates to a semiconductor device and more particularly relates to an environmental barrier for a semiconductor device.

SUMMARY

Embodiments of a multi-layer environmental barrier for a semiconductor device and methods of manufacturing the same are disclosed. In one embodiment, a semiconductor device is formed on a semiconductor die. The semiconductor die includes a semiconductor body and a passivation structure on the semiconductor body. A multi-level environmental barrier is provided on the passivation structure. The multi-layer environmental barrier is a low-defect multi-layer dielectric film that hermetically seals the semiconductor device from the environment. In one embodiment, the multi-layer environmental barrier has a defect density of less than 10 defects per square centimeter ($cm^2$). Further, in one embodiment, the multi-layer environmental barrier has a pin hole density of less than 10 pin holes per $cm^2$. By having a low defect density and a low pin hole density, the multi-layer environmental barrier serves as a robust barrier to the environment.

In one embodiment, the multi-layer environmental barrier includes multiple Plasma Enhanced Chemical Vapor Deposition (PECVD) and/or Atomic Layer Deposition (ALD) layers of two or more different dielectric materials. In another embodiment, the multi-layer environmental barrier includes a first layer of a first dielectric material, a second layer of a second dielectric material, and a third layer of the first dielectric material. In another embodiment, the multi-layer environmental barrier includes a repeating structure of a first layer of a first dielectric material and a second layer of a second dielectric material. In one embodiment, each of the layers in the repeating structure is formed by PECVD or ALD.

In one embodiment, the multi-layer environmental barrier includes a first silicon nitride layer on the passivation structure, a silicon dioxide layer on the first silicon nitride layer, and a second silicon nitride layer on the silicon dioxide layer. In another embodiment, the multi-layer environmental barrier includes a repeating structure of a silicon nitride layer and a silicon dioxide layer on the silicon nitride layer. In one embodiment, each of the layers in the repeating structure is formed by PECVD or ALD.

In one embodiment, the multi-layer environmental barrier includes a first silicon nitride layer on the passivation structure, a polymer layer on the first silicon nitride layer, and a second silicon nitride layer on the polymer layer. In another embodiment, the multi-layer environmental barrier includes a repeating structure of a silicon nitride layer and a polymer layer on the silicon nitride layer. In one embodiment, each of the layers in the repeating structure is formed by PECVD or ALD.

In one embodiment, the multi-layer environmental barrier includes a silicon nitride layer on the passivation structure, a silicon oxynitride layer on the silicon nitride layer, and a silicon dioxide layer on the silicon oxynitride layer. In another embodiment, the multi-layer environmental barrier includes a repeating structure of a silicon nitride layer, a silicon oxynitride layer on the silicon nitride layer, and a silicon dioxide layer on the silicon oxynitride layer. In one embodiment, each of the layers in the repeating structure is formed by PECVD or ALD.

In one embodiment, a method of fabricating a semiconductor die and, in particular a semiconductor device on a semiconductor die, includes providing a semiconductor body, providing a passivation structure on the semiconductor body, and providing a multi-layer environmental barrier on the passivation structure. The multi-layer environmental barrier is a low-defect multi-layer dielectric film that hermetically seals the semiconductor device from the environment. In one embodiment, the multi-layer environmental barrier has a defect density of less than 10 defects per square $cm^2$. Further, in one embodiment, the multi-layer environmental barrier has a pin hole density of less than 10 pin holes per $cm^2$. By having a low defect density and a low pin hole density, the multi-layer environmental barrier serves as a robust barrier to the environment.

In one embodiment, providing the multi-layer environmental barrier includes depositing multiple dielectric layers of two or more different dielectric materials via PECVD and/or ALD. In another embodiment, providing the multi-layer environmental barrier includes providing a first layer of a first dielectric material on the passivation structure, providing a second layer of a second dielectric material on the first layer, and providing a third layer of the first dielectric material on the second layer. In another embodiment, providing the multi-layer environmental barrier includes providing a repeating structure of a first layer of a first dielectric material and a second layer of a second dielectric material on the first layer of the first dielectric material. In one embodiment, each of the layers in the repeating structure is provided by PECVD or ALD.

In one embodiment, providing the multi-layer environmental barrier includes providing a first silicon nitride layer on the passivation structure, providing a silicon dioxide layer on the first silicon nitride layer, and providing a second silicon nitride layer on the silicon dioxide layer. In another embodiment, providing the multi-layer environmental barrier includes providing a repeating structure of a silicon nitride layer and a silicon dioxide layer on the silicon nitride layer. In one embodiment, each of the layers in the repeating structure is provided by PECVD or ALD.

In one embodiment, providing the multi-layer environmental barrier includes providing a first silicon nitride layer on the passivation structure, providing a polymer layer on the first silicon nitride layer, and providing a second silicon nitride layer on the polymer layer. In another embodiment, providing the multi-layer environmental barrier includes providing a repeating structure of a silicon nitride layer and a polymer layer on the silicon nitride layer. In one embodiment, each of the layers in the repeating structure is provided by PECVD or ALD.

In one embodiment, providing the multi-layer environmental barrier includes providing a silicon nitride layer on the passivation structure, providing a silicon oxynitride layer on the silicon nitride layer, and providing a silicon dioxide layer on the silicon oxynitride layer. In another embodiment, providing the multi-layer environmental barrier includes providing a repeating structure of a silicon nitride layer, a silicon oxynitride layer on the silicon nitride layer, and a silicon dioxide layer on the silicon oxynitride layer. In one embodiment, each of the layers in the repeating structure is provided by PECVD or ALD.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Semiconductor devices are often required to operate in high temperature and/or high humidity environments. If moisture is allowed to reach these semiconductor devices, then there will be corrosion of the semiconductor devices which, of course, degrades the performance of the semiconductor devices. In some applications, semiconductor devices are hermetically sealed within a package. In these applications, the semiconductor devices are protected from the environment. However, in other applications, the packages in which the semiconductor devices are incorporated do not provide a hermetic seal against the environment. In these applications, it is desirable to provide an environmental barrier on the semiconductor devices (i.e., a die level environmental barrier) that protects the semiconductor devices from the environment.

Embodiments of a multi-layer environmental barrier for a semiconductor device and methods of manufacturing the same are disclosed. Before discussing those embodiments in detail, a brief discussion of one conventional environmental barrier is beneficial. Commonly owned and assigned U.S. Pat. No. 7,525,122, entitled PASSIVIATION OF WIDE BAND-GAP BASED SEMICONDCUTOR DEVICES WITH HYDROGEN-FREE SPUTTERED NITRIDES, which issued on Apr. 28, 2009, discloses the use of a Plasma Enhanced Chemical Vapor Deposition (PECVD) Silicon Nitride (SiN) layer as an environmental barrier for a semiconductor device. The inventors found that while a PECVD SiN layer serves as a suitable environmental barrier in many implementations, there is a need for an improved environmental barrier. In particular, the inventors found that a PECVD SiN layer, or film, is prone to forming defects, namely, pin holes and columnar structures. These defects allow moisture to penetrate the PECVD SiN layer and reach the semiconductor device. As discussed below, the multi-layer environmental barrier is a low-defect material that provides an improved environmental barrier for a semiconductor device.

Figure 1:
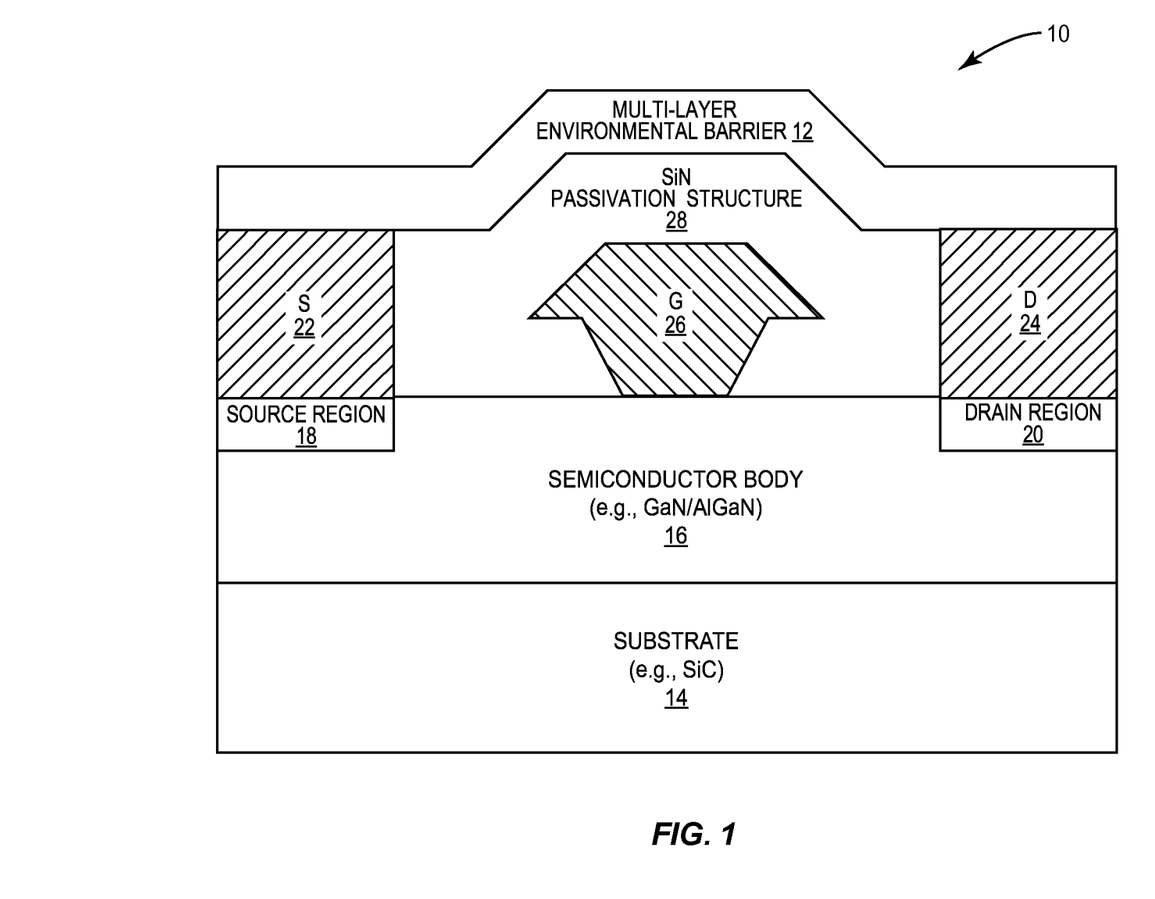
FIG. 1 illustrates a semiconductor device that includes a multi-layer environmental barrier according to one embodiment of the present disclosure.

In this regard, FIG. 1 illustrates a semiconductor device 10 that includes a multi-layer environmental barrier 12 according to one embodiment of the present disclosure. In this embodiment, the semiconductor device 10 is a Metal-Semiconductor Field Effect Transistor (MESFET) and, as such, the semiconductor device 10 is also referred to herein as a MESFET 10. Notably, the multi-layer environmental barrier 12 is not limited to use with the MESFET 10. Rather, the multi-layer environmental barrier 12 can be utilized as an environmental barrier for any suitable semiconductor device. Some examples of additional semiconductor devices with which the multi-layer environmental barrier 12 can be used are described below. However, these additional examples are only examples and are not to be construed as an exhaustive list of semiconductor devices with which the multi-layer environmental barrier 12 can be used.

As illustrated in FIG. 1, the MESFET 10 includes a substrate 14 and a semiconductor body 16 on a surface of the substrate 14. The substrate 14 is preferably formed of Silicon Carbide (SiC), but is not limited thereto. The substrate 14 may be formed of other materials such as, for example, Sapphire, Aluminum Nitride (AlN), Aluminum Gallium Nitride (AlGaN), Gallium Nitride (GaN), Silicon (Si), Gallium Arsenide (GaAs), Zinc Oxide (ZnO), and Indium Phosphide (InP). The semiconductor body 16 preferably includes one or more epitaxial layers of one or more wide bandgap materials such as, for example, one or more Group III nitrides. For example, the semiconductor body 16 may be formed of one or more layers of GaN or AlGaN. However, other Group III nitride materials may be used. As another example, both the substrate 14 and the semiconductor body 16 may be formed of SiC.

A source region 18 and a drain region 20 are formed in the semiconductor body 16 by, for example, implanting appropriate ions into a surface of the semiconductor body 16 to achieve a desired doping concentration. A source contact 22 is formed by one or more metallic layers on, and preferably directly on, the surface of the semiconductor body 16 over the source region 18. Likewise, a drain contact 24 is formed by one or more metallic layers on, and preferably directly on, the surface of the semiconductor body 16 over the drain region 20. The source and drain contacts 22 and 24 preferably provide low-resistance ohmic contacts to the source and drain regions 18 and 20, respectively. A gate contact 26 is formed by one or more metallic layers on, and preferably directly on, a surface of the semiconductor body 16 between the source region 18 and the drain region 20. The region within the semiconductor body 16 between the source and drain regions 18 and 20 is referred to as a channel region of the MESFET 10.

In this embodiment, an SiN passivation structure 28 is formed on the surface of the semiconductor body 16 between the source contact 22 and the gate contact 26 and between the drain contact 24 and the gate contact 26. Further, in this embodiment, the SiN passivation structure 28 extends over the gate contact 26. The SiN passivation structure 28 serves to passivate the surface of the semiconductor body 16 (i.e., passivate dangling bonds at the surface of the semiconductor body 16). While the details of the SiN passivation structure 28 are not essential to the understanding of the present disclosure, for more information regarding some exemplary embodiments of the SiN passivation structure 28, the interested reader is directed to U.S. Pat. No. 7,525,122, which is mentioned above, as well as commonly owned and assigned U.S. patent application Ser. No. 13/644,506, entitled HYDROGEN MITIGATION SCHEMES IN THE PASSIVATION OF ADVANCED DEVICES, which was filed on Oct. 4, 2012, both of which are hereby incorporated herein by reference for their teachings regarding an SiN passivation structure. It should also be noted that while the SiN passivation structure 28 is illustrated as an SiN passivation structure, the SiN passivation structure 28 is not limited thereto.

Lastly, the semiconductor device 10 includes the multi-layer environmental barrier 12. As discussed below in detail, the multi-layer environmental barrier 12 includes multiple layers of two or more different dielectric materials. The inventors have found that, by using multiple layers of different dielectric materials, environmental barrier properties of the multi-layer environmental barrier 12 are substantially improved as compared to a similar single layer environmental barrier. While the inventors do not wish to be limited to any particular theory, the inventors believe that any defects in a first layer of the multi-layer environmental barrier 12 that is formed of a first dielectric material are disrupted by a second layer of the multi-layer environmental barrier 12 that is formed of a second dielectric material, and so on. As a result, the number of defects in the multi-layer environmental barrier 12 is very low, e.g., less than 10 defects per square centimeter ($cm^2$) or as low as or even less than 1 defect per $cm^2$. One particular type of defect that is of concern is a pin hole. As a result of the disruption of the defects, and in particular the pin holes, using layers of different dielectric materials, the number of pin holes in the multi-layer environmental barrier 12 is very low, e.g., less than 10 pin holes per $cm^2$ or as low as or even less than 1 pin hole per $cm^2$. The low defect density and the low pin hole density is particularly beneficial for and is a substantial improvement for PECVD.

Figure 2:
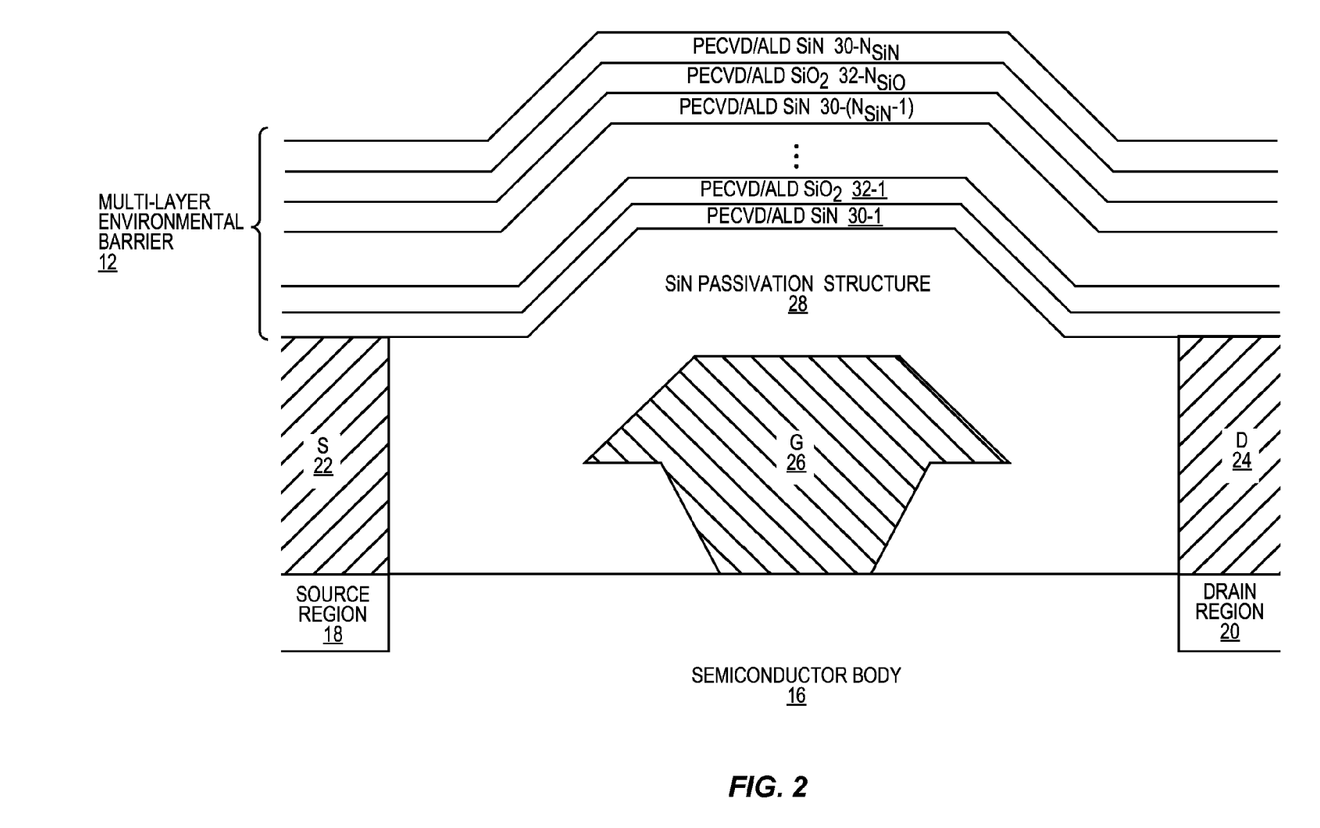
FIG. 2 is a more detailed illustration of the multi-layer environmental barrier of FIG. 1 according to one embodiment of the present disclosure.

FIG. 2 illustrates one embodiment of the multi-layer environmental barrier 12 of FIG. 1. As illustrated, in this embodiment, the multi-layer environmental barrier 12 includes multiple SiN layers 30-1 through 30-$N_{SiN}$ (more generally referred to herein collectively as SiN layers 30 and individually as SiN layer 30) and multiple Silicon Dioxide ($SiO_2$) layers 32-1 through 32-$N_{SiO}$ (more generally referred to herein collectively as $SiO_2$ layers 32 and individually as $SiO_2$ layer 32) arranged in an alternating pattern. The number ($N_{SiN}$) of SiN layers 30 is greater than or equal to 2, and the number ($N_{SiO}$) of $SiO_2$ layers 32 is greater than or equal to 1. In this embodiment, the multi-layer environmental barrier 12 both begins and ends with an SiN layer, namely, the SiN layers 30-1 and 30-$N_{SiN}$, respectively. However, the multi-layer environmental barrier 12 may alternatively end with an $SiO_2$ layer (i.e., the $SiO_2$ layer 32-$N_{SiO}$).

In one embodiment, the number ($N_{SiN}$) of SiN layers 30 is 2 and the number ($N_{SiO}$) of $SiO_2$ layers 32 is 1 such that the multi-layer environmental barrier 12 includes only the SiN layer 30-1, the $SiO_2$ layer 32-1, and the SiN layer 30-2. However, in another embodiment, the multi-layer environmental barrier 12 includes a repeating structure of two or more SiN layers 30 and two or more $SiO_2$ layers 32 in an SiN/$SiO_2$ pattern. Then, in the illustrated embodiment, the multi-layer environmental barrier 12 further includes the final SiN layer 30-$N_{SiN}$ on the repeating structure formed by the SiN layers 30-1 through 30-($N_{SiN}$−1) and the SiO$_2$ layers 32-1 through 32-$N_{SiO}$. In other words, in the repeating structure, the structure of an SiN layer 30 and an SiO$_2$ layer 32 on the SiN layer 30 is repeated $N_{SiO}$ times, and, in the illustrated embodiment, the repeating structure is then terminated by the final SiN layer 30-$N_{SiN}$.

The SiN layers 30-1 through 30-$N_{SiN}$ and the SiO$_2$ layers 32-1 through 32-$N_{SiO}$ are preferably formed using PECVD and/or Atomic Layer Deposition (ALD). In one particular embodiment, all of the SiN layers 30-1 through 30-$N_{SiN}$ and all of the SiO$_2$ layers 32-1 through 32-$N_{SiO}$ are formed using PECVD. In another particular embodiment, all of the SiN layers 30-1 through 30-$N_{SiN}$ and all of the SiO$_2$ layers 32-1 through 32-$N_{SiO}$ are formed using ALD. In yet another embodiment, some of the layers 30-1 through 30-$N_{SiN}$ and 32-1 through 32-$N_{SiO}$ are formed using PECVD and the rest of the layers 30-1 through 30-$N_{SiN}$ and 32-1 through 32-$N_{SiO}$ are formed using ALD. In one embodiment, a total thickness of the multi-layer environmental barrier 12 is in a range of and including 0.01 micrometers (μm) to 10 μm, and more preferably in a range of and including 0.1 μm to 5 μm. Thicknesses of each of the SiN layers 30-1 through 30-$N_{SiN}$ may, for example, be in a range of and including 5 to 1000 Angstroms in one embodiment or in a range of and including 10 to 100 Angstroms in another embodiment. Further, all of the SiN layers 30-1 through 30-$N_{SiN}$ may have the same thickness or some or all of the SiN layers 30-1 through 30-$N_{SiN}$ may have different thicknesses. Likewise, thicknesses of each of the SiO$_2$ layers 32-1 through 32-$N_{SiO}$ may, for example, be in a range of and including 5 to 1000 Angstroms in one embodiment or in a range of and including 10 to 100 Angstroms in another embodiment. Further, all of the SiO$_2$ layers 32-1 through 32-$N_{SiO}$ may have the same thickness or some or all of the SiO$_2$ layers 32-1 through 32-$N_{SiO}$ may have different thicknesses.

Figure 3:
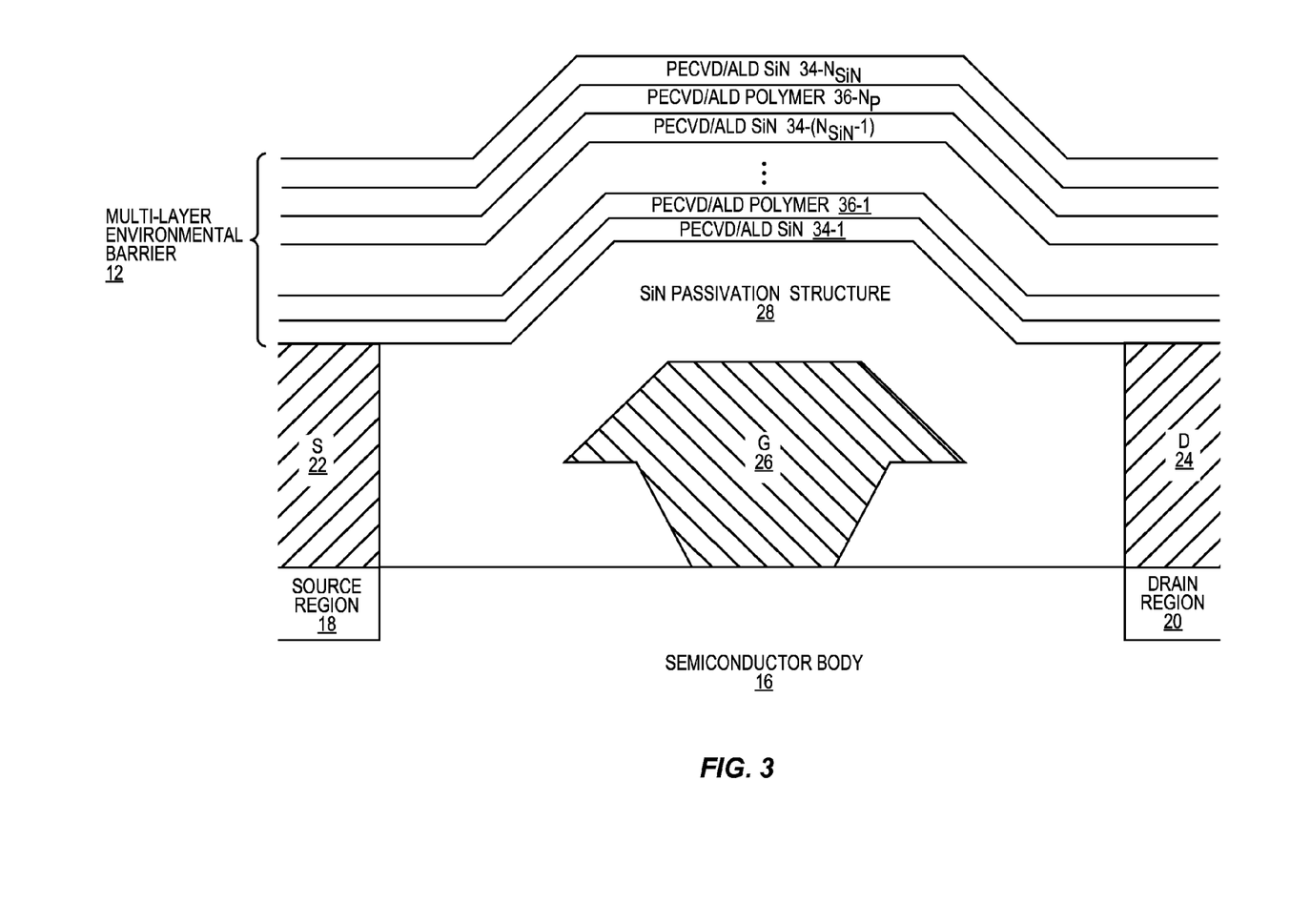
FIG. 3 is a more detailed illustration of the multi-layer environmental barrier of FIG. 1 according to another embodiment of the present disclosure.

FIG. 3 illustrates another embodiment of the multi-layer environmental barrier 12 of FIG. 1. As illustrated, in this embodiment, the multi-layer environmental barrier 12 includes multiple SiN layers 34-1 through 34-$N_{SiN}$ (more generally referred to herein collectively as SiN layers 34 and individually as SiN layer 34) and multiple polymer layers 36-1 through 36-$N_P$ (more generally referred to herein collectively as polymer layers 36 and individually as polymer layer 36) arranged in an alternating pattern. The number ($N_{SiN}$) of SiN layers 34 is greater than or equal to 2, and the number ($N_P$) of polymer layers 36 is greater than or equal to 1. In this embodiment, the multi-layer environmental barrier 12 both begins and ends with an SiN layer, namely, the SiN layers 34-1 and 34-$N_{SiN}$, respectively. However, the multi-layer environmental barrier 12 may alternatively end with a polymer layer (i.e., the polymer layer 36-$N_P$). The polymer layers 36 can be formed of any suitable polymer having a low dielectric constant (e.g., less than or approximately equal to that of SiN or less than or approximately equal to that of SiO$_2$). In one embodiment, the polymer used for the polymer layers 36 is an inorganic polymer but may alternatively be an organic polymer.

In one embodiment, the number ($N_{SiN}$) of SiN layers 34 is 2 and the number ($N_P$) of polymer layers 36 is 1 such that the multi-layer environmental barrier 12 includes only the SiN layer 34-1, the polymer layer 36-1, and the SiN layer 34-2. However, in another embodiment, the multi-layer environmental barrier 12 includes a repeating structure of two or more SiN layers 34 and two or more polymer layers 36 in an SiN/polymer pattern. Then, in the illustrated embodiment, the multi-layer environmental barrier 12 further includes the final SiN layer 34-$N_{SiN}$ on the repeating structure formed by the SiN layers 34-1 through 34-($N_{SiN}$−1) and the polymer layers 36-1 through 36-$N_P$. In other words, in the repeating structure, the structure of an SiN layer 34 and a polymer layer 36 on the SiN layer 34 is repeated $N_P$ times, and, in the illustrated embodiment, the repeating structure is then terminated by the final SiN layer 34-$N_{SiN}$.

The SiN layers 34-1 through 34-$N_{SiN}$ and the polymer layers 36-1 through 36-$N_P$ are preferably formed using PECVD and/or ALD. In one particular embodiment, all of the SiN layers 34-1 through 34-$N_{SiN}$ and all of the polymer layers 36-1 through 36-$N_P$ are formed using PECVD. In another particular embodiment, all of the SiN layers 34-1 through 34-$N_{SiN}$ and all of the polymer layers 36-1 through 36-$N_P$ are formed using ALD. In yet another embodiment, some of the layers 34-1 through 34-$N_{SiN}$ and 36-1 through 36-$N_P$ are formed using PECVD and the rest of the layers 34-1 through 34-$N_{SiN}$ and 36-1 through 36-$N_P$ are formed using ALD. In one embodiment, a total thickness of the multi-layer environmental barrier 12 is in a range of and including 0.01 μm to 10 μm, and more preferably in a range of and including 0.1 μm to 5 μm. Thicknesses of each of the SiN layers 34-1 through 34-$N_{SiN}$ may, for example, be in a range of and including 5 to 1000 Angstroms in one embodiment or in a range of and including 10 to 100 Angstroms in another embodiment. Further, all of the SiN layers 34-1 through 34-$N_{SiN}$ may have the same thickness or some or all of the SiN layers 34-1 through 34-$N_{SiN}$ may have different thicknesses. Likewise, thicknesses of each of the polymer layers 36-1 through 36-$N_P$ may, for example, be in a range of and including 5 to 1000 Angstroms in one embodiment or in a range of and including 10 to 100 Angstroms in another embodiment. Further, all of the polymer layers 36-1 through 36-$N_P$ may have the same thickness or some or all of the polymer layers 36-1 through 36-$N_P$ may have different thicknesses.

Figure 4:
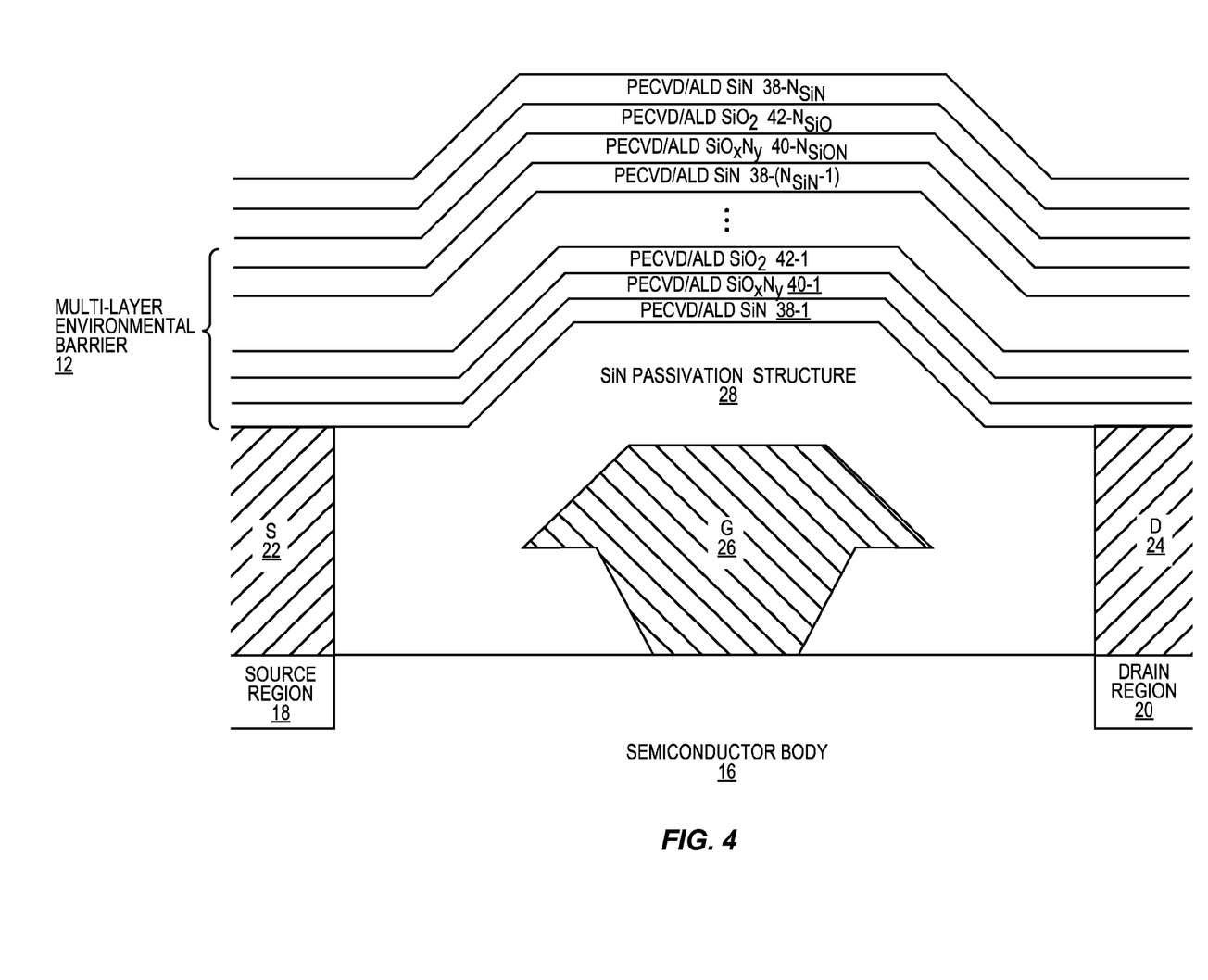
FIG. 4 is a more detailed illustration of the multi-layer environmental barrier of FIG. 1 according to another embodiment of the present disclosure.

FIG. 4 illustrates another embodiment of the multi-layer environmental barrier 12 of FIG. 1. As illustrated, in this embodiment, the multi-layer environmental barrier 12 includes multiple SiN layers 38-1 through 38-$N_{SiN}$ (more generally referred to herein collectively as SiN layers 38 and individually as SiN layer 38), multiple Silicon Oxynitride (SiO$_X$N$_Y$) layers 40-1 through 40-$N_{SiON}$ (more generally referred to herein collectively as SiO$_X$N$_Y$ layers 40 and individually as SiO$_X$N$_Y$ layer 40) where X and Y are both greater than 0, and multiple SiO$_2$ layers 42-1 through 42-$N_{SiO}$ (more generally referred to herein collectively as SiO$_2$ layers 42 and individually as SiO$_2$ layer 42) arranged in an SiN/SiO$_X$N$_Y$/SiO$_2$ pattern. The SiO$_X$N$_Y$ layers 40-1 through 40-$N_{SiON}$ are preferably formed of SiO$_X$N$_Y$ having a refractive index measured at 632 nanometers (nm) in a range of 1.9 to 1.95. Notably, the refractive index of SiO$_X$N$_Y$ at 632 nm ranges from approximately 1.4 for SiO$_2$ (i.e., Y=0) to approximately 2 for SiN (i.e., X=0). Thus, SiO$_X$N$_Y$ having a refractive index measured at 632 nm in the range of 1.9 to 1.95 is a nitride-rich SiO$_X$N$_Y$.

The number ($N_{SiN}$) of SiN layers 38 is greater than or equal to 2, the number ($N_{SiON}$) of SiO$_X$N$_Y$ layers 40 is greater than or equal to 1, and the number ($N_{SiO}$) of SiO$_2$ layers 42 is greater than or equal to 1. In this embodiment, the multi-layer environmental barrier 12 both begins and ends with an SiN layer, namely, the SiN layers 38-1 and 38-$N_{SiN}$, respectively. However, the multi-layer environmental barrier 12 may alternatively end with an SiO$_X$N$_Y$ layer 40 or an SiO$_2$ layer 42 (i.e., the SiO$_X$N$_Y$ layer 40-$N_{SiON}$ or the SiO$_2$ layer 42-$N_{SiO}$). In one embodiment, the number ($N_{SiN}$) of SiN layers 38 is 2, the number ($N_{SiON}$) of SiO$_X$N$_Y$ layers 40 is 1, and the number ($N_{SiO}$) of $SiO_2$ layers 32 is 1 such that the multi-layer environmental barrier 12 includes only the SiN layer 38-1, the $SiO_XN_Y$ layer 40-1, the $SiO_2$ layer 42-1, and the SiN layer 38-2. However, in another embodiment, the multi-layer environmental barrier 12 includes a repeating structure of two or more SiN layers 38, two or more $SiO_XN_Y$ layers 40, and two or more $SiO_2$ layers 42 in an $SiN/SiO_XN_Y/SiO_2$ pattern. Then, in the illustrated embodiment, the multi-layer environmental barrier 12 further includes the final SiN layer 38-$N_{SiN}$ on the repeating structure formed by the SiN layers 38-1 through 38-($N_{SiN}$-1), the $SiO_XN_Y$ layers 40-1 through 40-$N_{SiON}$, and the $SiO_2$ layers 42-1 through 42-$N_{SiO}$. In other words, in the repeating structure, the structure of an SiN layer 38, an $SiO_XN_Y$ layer 40 on the SiN layer 38, and an $SiO_2$ layer 42 on the $SiO_XN_Y$ layer 40 is repeated $N_{SiON}$ (or equivalently $N_{SiO}$) times, and, in the illustrated embodiment, the repeating structure is then terminated by the final SiN layer 38-$N_{SiN}$.

The SiN layers 38-1 through 38-$N_{SiN}$, the $SiO_XN_Y$ layers 40-1 through 40-$N_{SiON}$, and the $SiO_2$ layers 42-1 through 42-$N_{SiO}$ are preferably formed using PECVD and/or ALD. In one particular embodiment, all of the SiN layers 38-1 through 38-$N_{SiN}$, all of the $SiO_XN_Y$ layers 40-1 through 40-$N_{SiON}$, and all of the $SiO_2$ layers 42-1 through 42-$N_{SiO}$ are formed using PECVD. In another particular embodiment, all of the SiN layers 38-1 through 38-$N_{SiN}$, all of the $SiO_XN_Y$ layers 40-1 through 40-$N_{SiON}$, and all of the $SiO_2$ layers 42-1 through 42-$N_{SiO}$ are formed using ALD. In yet another embodiment, some of the layers 38-1 through 38-$N_{SiN}$, 40-1 through 40-$N_{SiON}$, and 42-1 through 42-$N_{SiO}$ are formed using PECVD and the rest of the layers 38-1 through 38-$N_{SiN}$, 40-1 through 40-$N_{SiON}$, and 42-1 through 42-$N_{SiO}$ are formed using ALD. In one embodiment, a total thickness of the multi-layer environmental barrier 12 is in a range of and including 0.01 μm to 10 μm, and more preferably in a range of and including 0.1 μm to 5 μm. Thicknesses of each of the SiN layers 38-1 through 38-$N_{SiN}$ may, for example, be in a range of and including 5 to 1000 Angstroms in one embodiment or in a range of and including 10 to 100 Angstroms in another embodiment. Further, all of the SiN layers 38-1 through 38-$N_{SiN}$ may have the same thickness or some or all of the SiN layers 38-1 through 38-$N_{SiN}$ may have different thicknesses. Likewise, thicknesses of each of the $SiO_XN_Y$ layers 40-1 through 40-$N_{SiON}$ may, for example, be in a range of and including 5 to 1000 Angstroms in one embodiment or in a range of and including 10 to 100 Angstroms in another embodiment. Further, all of the $SiO_XN_Y$ layers 40-1 through 40-$N_{SiON}$ may have the same thickness or some or all of the $SiO_XN_Y$ layers 40-1 through 40-$N_{SiON}$ may have different thicknesses. In the same manner, thicknesses of each of the $SiO_2$ layers 42-1 through 42-$N_{SiO}$ may, for example, be in a range of and including 5 to 1000 Angstroms in one embodiment or in a range of and including 10 to 100 Angstroms in another embodiment. Further, all of the $SiO_2$ layers 42-1 through 42-Nso may have the same thickness or some or all of the $SiO_2$ layers 42-1 through 42-$N_{SiO}$ may have different thicknesses.

Figure 5:
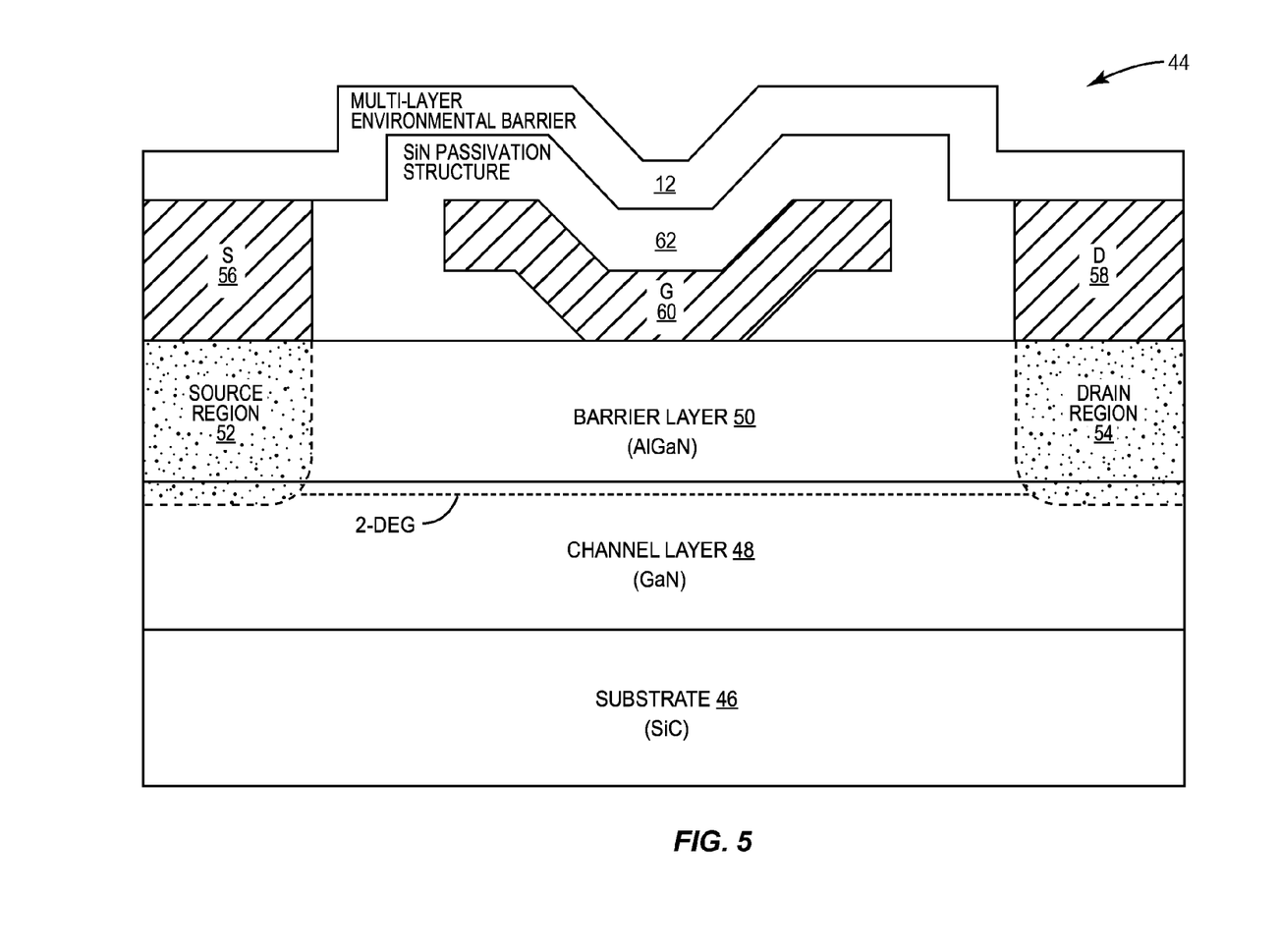
FIG. 5 illustrates a semiconductor device that includes a multi-layer environmental barrier according to one embodiment of the present disclosure.

As discussed above, the applicability of the multi-layer environmental barrier 12 is not limited to the MESFET 10. For example, the multi-layer environmental barrier 12 may also be used with respect to a High Electron Mobility Transistor (HEMT) 44, as illustrated in FIG. 5. In this example, the HEMT 44 is formed in a Group III nitride material system on a substrate 46. In particular, the HEMT 44 is formed in a GaN/AlGaN material system, and the substrate 46 is formed of SiC. The substrate 46 is a semi-insulating substrate. The term "semi-insulating" is used in a relative rather than an absolute sense. Alternative materials for the substrate 46 include Sapphire, AlN, AlGaN, GaN, Si, GaAs, ZnO, and InP. The substrate 46 is generally between 300 μm and 500 μm thick.

A channel layer 48 is formed on a surface of the substrate 46. Notably, as will be appreciated by one of ordinary skill in the art, a nucleation layer is typically formed between the substrate 46 and the channel layer 48 to provide an appropriate crystal structure transition between the substrate 46 and the channel layer 48. The channel layer 48 is formed by one or more epitaxial layers. For this example, the channel layer 48 is GaN. However, the channel layer 48 may more generally be a Group III nitride such as GaN, $Al_XGa_{1-X}N$ where 0≤X<1, Indium Gallium Nitride (InGaN), Aluminum Indium Gallium Nitride (AlInGaN), or the like. The channel layer 48 may be undoped, or at least unintentionally doped, and may be grown to a thickness of greater than about 20 Angstroms. In certain embodiments, the channel layer 48 may employ a multi-layer structure, such as a superlattice or alternating layers of different Group III nitrides, such as GaN, AlGaN, or the like.

A barrier layer 50 is formed on the channel layer 48. The barrier layer 50 may have a bandgap that is greater than a bandgap of the underlying channel layer 48. Further, the barrier layer 50 may have a smaller electron affinity than the channel layer 48. In this illustrated embodiment, the barrier layer 50 is AlGaN; however, the barrier layer 50 may include AlGaN, AlInGaN, AlN, or various combinations of these layers. The barrier layer 50 is generally between 20 Angstroms and 400 Angstroms thick; however, the barrier layer 50 should not be so thick as to cause cracking or substantial defect formation therein. The barrier layer 50 may be either undoped, or at least unintentionally doped, or doped with an n-type dopant to a concentration less than about $1 \times 10^{19}$ $cm^{-3}$. Notably, together, the channel layer 48 and the barrier layer 50 form a semiconductor body of the HEMT 44.

A source region 52 and a drain region 54 are formed in the semiconductor body by, for example, implanting appropriate ions into a surface of the barrier layer 50 to achieve a desired depth and doping concentration. The source and drain regions 52 and 54 extend just below the interface between the channel layer 48 and the barrier layer 50 where a two-dimensional electron gas (2-DEG) plane is formed during operation and in which electron conductivity is modulated. A source contact 56 is formed by one or more metallic layers on, and preferably directly on, the surface of the barrier layer 50 over the source region 52. Likewise, a drain contact 58 is formed by one or more metallic layers on, and preferably directly on, the surface of the barrier layer 50 over the drain region 54. The source and drain contacts 56 and 58 preferably provide low-resistance ohmic contacts to the source and drain regions 52 and 54, respectively. A gate contact 60 is formed by one or more metallic layers on, and preferably directly on, a surface of the barrier layer 50 between the source region 52 and the drain region 54.

An SiN passivation structure 62 is formed on the surface of the semiconductor body, and specifically on the surface of the barrier layer 50, between the source contact 56 and the gate contact 60 and between the drain contact 58 and the gate contact 60. In this embodiment, the SiN passivation structure 62 extends over the gate contact 60. The SiN passivation structure 62 may be the same or substantially the same as the SiN passivation structure 28 of FIG. 1. Lastly, the HEMT 44 includes the multi-layer environmental barrier 12 on the SiN passivation structure 62. The details of the multi-layer environmental barrier 12 are the same as described above and are therefore not repeated.

Figure 6:
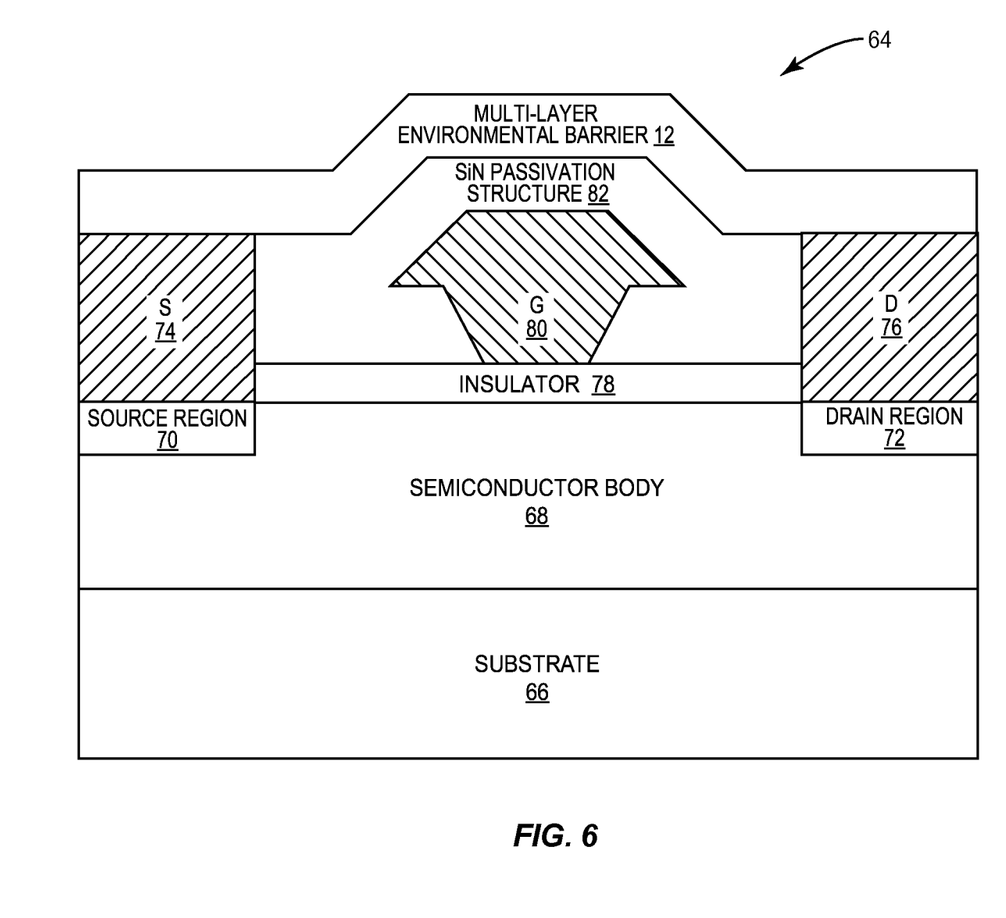
FIG. 6 illustrates a semiconductor device that includes a multi-layer environmental barrier according to one embodiment of the present disclosure.

As another example, the multi-layer environmental barrier 12 may be used with respect to a Metal Oxide Semiconductor Field Effect Transistor (MOSFET) 64, as illustrated in FIG. 6. In this example, the MOSFET 64 includes a substrate 66 and a semiconductor body 68 on a surface of the substrate 66. The substrate 66 is preferably formed of SiC, but is not limited thereto. The substrate 66 may be formed of other materials such as, for example, Sapphire, AlN, AlGaN, GaN, Si, GaAs, ZnO, and InP. The semiconductor body 68 preferably includes one or more epitaxial layers of one or more wide bandgap materials such as, for example, one or more Group III nitrides. For example, the semiconductor body 68 may be formed of one or more layers of GaN or AlGaN. However, other Group III nitride materials may be used.

A source region 70 and a drain region 72 are formed in the semiconductor body 68 by, for example, implanting appropriate ions into a surface of the semiconductor body 68 to achieve a desired doping concentration. A source contact 74 is formed by one or more metallic layers on, and preferably directly on, the surface of the semiconductor body 68 over the source region 70. Likewise, a drain contact 76 is formed by one or more metallic layers on, and preferably directly on, the surface of the semiconductor body 68 over the drain region 72. The source and drain contacts 74 and 76 preferably provide low-resistance ohmic contacts to the source and drain regions 70 and 72, respectively.

In this embodiment, an insulator layer 78 is formed on, and preferably directly on, a surface of the semiconductor body 68 between the source and drain contacts 74 and 76. The insulator layer 78 may be, for example, one or more oxide layers (e.g., $SiO_2$). A gate contact 80 is formed by one or more metallic layers on, and preferably directly on, a surface of the insulator layer 78. The region within the semiconductor body 68 between the source and drain regions 70 and 72 is referred to as a channel region of the MOSFET 64.

An SiN passivation structure 82 is formed on the surface of the semiconductor body 68, and more specifically on a surface of the insulator layer 78, between the source contact 74 and the gate contact 80 and between the drain contact 76 and the gate contact 80. In this embodiment, the SiN passivation structure 82 extends over the gate contact 80. The SiN passivation structure 82 may be the same or substantially the same as the SiN passivation structure 28 of FIG. 1. Lastly, the MOSFET 64 includes the multi-layer environmental barrier 12 on the SiN passivation structure 82. The details of the multi-layer environmental barrier 12 are the same as described above and are therefore not repeated. Again, it should be noted that the MESFET 10, the HEMT 44, and the MOSFET 64 are only a few examples of semiconductor devices for which the multi-layer environmental barrier 12 can be used. The multi-layer environmental barrier 12 can be used for any semiconductor device for which an environmental barrier is desired.

Those skilled in the art will recognize improvements and modifications to the preferred embodiments of the present disclosure. All such improvements and modifications are considered within the scope of the concepts disclosed herein and the claims that follow.

What is claimed is:
1. A semiconductor die comprising:
   a semiconductor body;
   a passivation structure on the semiconductor body; and
   a multi-layer environmental barrier on the passivation structure, the multi-layer environmental barrier comprising three layers of different materials, wherein the multi-layer environmental barrier has a repeating structure and there are at least two repeating structures.

2. The semiconductor die of claim 1 wherein the multi-layer environmental barrier comprises multiple Plasma Enhanced Chemical Vapor Deposition (PECVD) layers.

3. The semiconductor die of claim 2 wherein the multi-layer environmental barrier has less than 10 defects per square centimeter.

4. The semiconductor die of claim 1 wherein the multi-layer environmental barrier comprises multiple Atomic Layer Deposition (ALD) layers.

5. The semiconductor die of claim 1 wherein the passivation structure comprises silicon nitride.

6. The semiconductor die of claim 1, wherein the multi-layer environmental barrier comprises at least a silicon nitride layer and a silicon oxide layer.

7. The semiconductor die of claim 1, wherein the multi-layer environmental barrier comprises a silicon nitride layer, a silicon oxynitride layer, and a silicon oxide layer.

8. The semiconductor die of claim 1 wherein the semiconductor die is a High Electron Mobility Transistor.

9. The semiconductor die of claim 1 wherein the semiconductor die is a Metal Oxide Semiconductor Field Effect Transistor.

10. A method comprising:
    providing a semiconductor body;
    providing a passivation structure on the semiconductor body; and
    providing a multi-layer environmental barrier on the passivation structure, the multi-layer environmental barrier comprising three layers of different materials, wherein the multi-layer environmental barrier has a repeating structure and there are at least two repeating structures.

11. The method of claim 10 wherein providing the multi-layer environmental barrier comprises providing multiple Plasma Enhanced Chemical Vapor Deposition (PECVD) layers.

12. The method of claim 10 wherein providing the multi-layer environmental barrier comprises providing multiple Atomic Layer Deposition (ALD) layers.

13. The method of claim 10 wherein the passivation structure comprises silicon nitride.

14. The method of claim 10 wherein the semiconductor body, the passivation structure, and the multi-layer environmental barrier form a High Electron Mobility Transistor.

15. The method of claim 10 wherein the semiconductor body, the passivation structure, and the multi-layer environmental barrier form a Metal Oxide Semiconductor Field Effect Transistor.

16. The method of claim 10, wherein the multi-layer environmental barrier comprises a silicon nitride layer and a silicon oxide layer.

17. The method of claim 10, wherein the multi-layer environmental barrier comprises a silicon nitride layer, a silicon oxynitride layer, and a silicon oxide layer.

* * * * *